United States Patent
Ono et al.

(10) Patent No.: US 6,489,236 B1
(45) Date of Patent: Dec. 3, 2002

(54) METHOD FOR MANUFACTURING A SEMICONDUCTOR DEVICE HAVING A SILICIDE LAYER

(75) Inventors: Atsuki Ono, Tokyo (JP); Kiyotaka Imai, Tokyo (JP)

(73) Assignee: NEC Corporation, Tokyo (JP)

( * ) Notice: Subject to any disclaimer, the term of this patent is extended or adjusted under 35 U.S.C. 154(b) by 47 days.

(21) Appl. No.: 09/692,471

(22) Filed: Oct. 20, 2000

(30) Foreign Application Priority Data

Oct. 20, 1999 (JP) .......................................... 11-297940

(51) Int. Cl.[7] ............................................. H01L 21/44
(52) U.S. Cl. .................... 438/664; 438/301; 438/305; 438/303; 438/680; 438/682; 438/683; 438/592; 257/388; 257/412; 257/382; 257/383
(58) Field of Search ................................. 438/664, 301, 438/303, 305, 680, 682, 683, 685, 592; 257/382, 383, 384, 388, 412

(56) References Cited

U.S. PATENT DOCUMENTS

| | | | | |
|---|---|---|---|---|
| 4,769,686 A | * | 9/1988 | Horiuchi et al. | 357/23.8 |
| 5,552,332 A | * | 9/1996 | Tseng et al. | 438/143 |
| 5,780,896 A | * | 7/1998 | Ono | 257/344 |
| 5,874,342 A | * | 2/1999 | Tsai et al. | 438/301 |
| 5,998,272 A | * | 12/1999 | Ishida et al. | 438/305 |
| 6,221,704 B1 | * | 4/2001 | Furukawa et al. | 438/197 |
| 6,235,597 B1 | * | 5/2001 | Miles | 438/301 |
| 6,236,094 B1 | * | 5/2001 | Wright | 257/413 |

OTHER PUBLICATIONS

S. P. Murarka et al., Self aligned cobalt Disilicide for Gate and Interconnection and Contacts to Shallow Junctions, IEEE Trans. ON Electron Devices, Oct. 1987, pp1987–2115.*
Ken–ichi Goto et al., Co Salicide Compatible 2–step Activation Annealing Process for Deca–nano Scaled MOSFETs, 1999 Symposium on VLSI Technology Digest of Technical Papers, pp49–50.*
S. Wolf, Silicon Processing for the VLSI Era, vol. I, pp307–308.*
S. Wolf, Silicon Processing for the VLSI Era, vol. II, pp21–22.*

* cited by examiner

*Primary Examiner*—Caridad Everhart
*Assistant Examiner*—B Keshavan
(74) *Attorney, Agent, or Firm*—Young & Thompson

(57) ABSTRACT

A method for forming a MOSFET includes the steps of forming cobalt silicide layers on a polysilicon gate electrode and source/drain regions, implanting impurity ions to form source/drain extensions and diffusing the impurity ions in the source/drain extensions The temperature of the heat treatment for diffusing step is lower than the maximum of the temperatures of the heat treatment for forming the silicide layer, whereby a MOSFET having excellent short-channel characteristics and a higher reliability can be obtained.

7 Claims, 3 Drawing Sheets

US 6,489,236 B1

METHOD FOR MANUFACTURING A SEMICONDUCTOR DEVICE HAVING A SILICIDE LAYER

BACKGROUND OF THE INVENTION (a) Field of the Invention

The present invention relates to a method for manufacturing a semiconductor device having a silicide layer and, more particularly, to a method for manufacturing a semiconductor device having a higher reliability and excellent short-channel characteristics.

(b) Description of the Related Art

For achieving a higher reliability of a semiconductor device, it is important to reduce the dimensions of the transistor elements. In particular, in a transistor element having a gate width on the order of 0.1 µm, a shallow junction structure with excellent short-channel characteristics is especially important. For example, the source-drain extension regions (referred to as SD-extensions hereinafter) needed for a reliable operation of the 0.1-µm-level transistor element should have a depth as low as 20 to 30 nm or below. To achieve such a shallow junction structure, several techniques are proposed and used heretofore which include an ion-implantation using low-energy ions, an ion-implantation for conversion from a polysilicon layer to an amorphous layer, and a short-time and low-temperature heat treatment for activation of impurity ions after the latter implantation. For example, in fabrication of the 0.1-µm-level transistor element, a heat treatment using a lamp annealer is conducted at a temperature of 1000° C. for 10 seconds after an ion-implantation for forming source/drain diffused regions.

A silicide process includes the steps of forming a refractory metal film on the surfaces of a polysilicon gate electrode and source/drain diffused regions having a specific conductivity-type and silicifying the refractory metal by reacting the same with underlying silicon in a heat treatment. The silicide process should meet the following requirements: that the silicide layer can be formed on a small-width gate electrode; and that the resistivity of the silicide layer does not depend on the heat treatment conducted at an ordinary temperature of 450° C. or a maximum temperature of 700° C. after formation of an overlying dielectric film. In the silicide process, a titanium silicide is generally used in a current 0.25 µm-rule MOSFET and a cobalt silicide is to be used in a next generation MOSFET having a smaller gate length for suppression of the line effect of the MOSFET. The term "line effect" as used herein means a phenomenon that a smaller gate length raises the sheet resistance of the silicide layer.

It is known that the silicon constituting the silicon substrate shifts or diffuses during the heat treatment at a temperature of 800° C. for 10 seconds in the silicide process. The shift of silicon atoms from the crystal lattice of the substrate generates an interstitial silicon atom and a vacancy in the silicon crystal lattice. These interstitial silicon atom and the vacancy significantly affect the rate of diffusion of implanted impurities such as boron and arsenic conducted for determining the electric characteristics of the transistors, and in particular, raises the diffusion rate of boron. More specifically, the silicide process uses a temperature lower than the temperature of a heat treatment for activation of diffused ions in the source/drain diffused regions, the silicide process has a larger influence upon the control of impurity diffusion compared to the heat treatment for activation.

A technique for solving the above problem is described in a literature "1999 Symposium VLSI Technology Digest of Technical Papers" pp49. This technique is described below, with reference to FIGS. 1A to 1G showing consecutive steps of fabrication of an nMOSFET.

FIGS. 1A to 1G show a conventional fabrication process of an nMOSFET having a silicide layer. In FIG. 1A, the surface area of a semiconductor substrate 11 is doped with boron as p-type impurities to form a p-well 21 so that the p-well 21 defines specific electric characteristics such as threshold of the nMOSFET. A gate insulator film 13 is formed on the p-well 21. The gate insulator film 13 is made of silicon oxide or silicon oxide nitride film including nitrogen at a concentration of 2 to 5%, in the case of a 0.1-µm-rule nMOSFET operating at a source voltage of 1.2 volts. A gate electrode 14 made of polysilicon having a thickness of 150 nm, for example, is formed on the gate insulator film 13.

After forming the gate electrode 14, as shown in FIG. 1B, a TiN film 45 is deposited on the entire surface by sputtering, followed by deposition of a silicon oxide film by using a CVD technique. The silicon oxide film is then subjected to etch-back thereof to leave a portion of the silicon oxide film on both the sides of the gate electrode 14 to form side-walls 55, as shown in FIG. 1C. Subsequently, as shown in FIG. 1D, an ion-implantation process is conducted to form source/drain diffused regions 17, followed by a heat treatment for activation of the implanted ions. The top portion of the side-walls 55 is then etched by using hydrofluoric acid, followed by deposition of consecutive cobalt film 82 and TiN film 84 by sputtering, as shown on FIG. 1E.

Subsequently, a heat treatment is conducted in a nitrogen ambient for silicidation, whereby a portion of the cobalt film formed on the source/drain diffused regions 17 is silicified to form cobalt silicide films 18, as shown in FIG. 1F, At this stage, silicidation does not occur on the side surfaces of the polysilicon film constituting the gate electrode 14 and the substrate region in the vicinity of the source/drain regions 17, whereby the cobalt silicide film is not formed thereon. Thereafter, remaining cobalt film not silicified and the TiN film on the sides of the gate electrode are removed by using sulfuric acid based etchant, as shown in FIG. 1F.

In the state after the removal of cobalt and TiN, ion-implantation processes for forming SD-extensions 61 and for forming a pocket regions 62 which assures the short-channel characteristics of the MOSFET are conducted, followed by a heat treatment using a rapid thermal annealing technique, as shown in FIG. 1G. Thereafter, known processes are conducted for forming contact-holes and interconnect layers similarly to a conventional fabrication process of the nMOSFET.

In the conventional silicide process, the shallow SD-extensions have a depth larger than a desired depth irrespective of the energy for the implanted ions being lowered as desired, because the implanted ions are thermally diffused to a larger depth region during the heat treatment for the silicidation. The depth of the junction formed by the thermal diffusion is far larger than the initial depth of the junction formed by the ion-implantation, the larger depth causing degradation of the short-channel characteristics of the MOSFET. Thus, a process is desired which is less susceptible to the heat treatment for silicidation with respect to the design depth for the shallow junction.

The literature as described above recites a process, wherein the silicide layer is formed before ion-implantation for forming the SD-extensions, thereby solving the above problem. However, the recited process raises another problem wherein the gate oxide film having a small thickness is damaged by the heat treatment for silicidation, thereby significantly lowering the reliability of the MOSFET. In addition, the temperature of a heat treatment conducted after a later ion-implantation step is not specified in the literature, whereby the recited process achieves only a limited advantage.

SUMMARY OF THE INVENTION

In view of the above problems in the silicide process in a conventional fabrication method for a MOSFET, it is an object of the present invention to provide a method for fabricating a semiconductor device including a MOSFET having excellent short-channel characteristics without degrading the reliability of the MOSFET.

The present invention provides a method for manufacturing a MOSFET including the steps of forming a gate electrode having a top surface including silicon and source/drain diffused regions disposed in operative relationship with the gate electrode in a silicon substrate, forming a refractory metal film at least on the gate electrode and the source/drain diffused regions, reacting the refractory metal film with underlying silicon to form a refractory metal silicide layer, implanting impurity ions into a portion of the silicon substrate to form source/drain extensions adjacent to the source/drain regions, and diffusing the impurity ions in the source/drain extensions at a temperature which is lower than a maximum of temperatures at which said reacting step is conducted.

In accordance with the method of the present invention, the configuration that the temperature of the heat treatment for forming the SD-extensions is lower than the maximum temperature of the heat treatment for silicidation allows the shallow junction to have a smaller depth thereby achieving excellent short-channel characteristics, and does not damage the gate oxide film and degrade the reliability of the MOSFET.

The above and other objects, features and advantages of the present invention will be more apparent from the following description, referring to the accompanying drawings.

PREFERRED EMBODIMENTS OF THE INVENTION

Figure 1A:
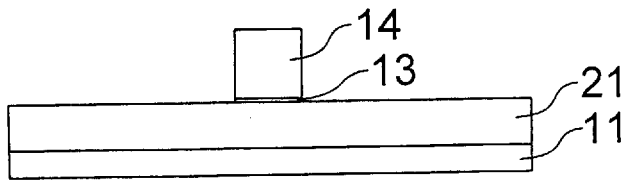
FIGS. 1A to 1G are sectional views of a MOSFET for showing consecutive steps of a conventional fabrication process thereof.
Figure 1B:
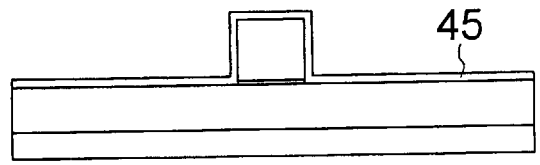
Figure 1C:
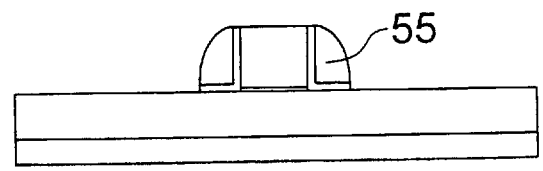
Figure 1D:
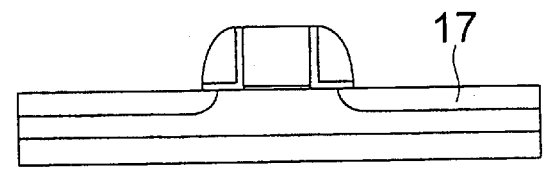
Figure 1E:
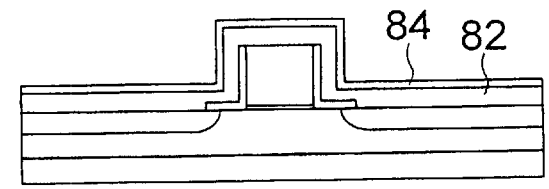
Figure 1F:
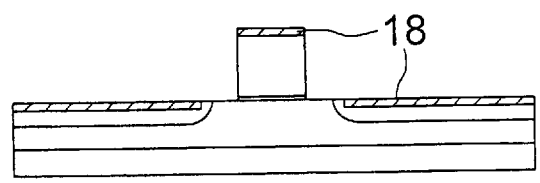
Figure 1G:
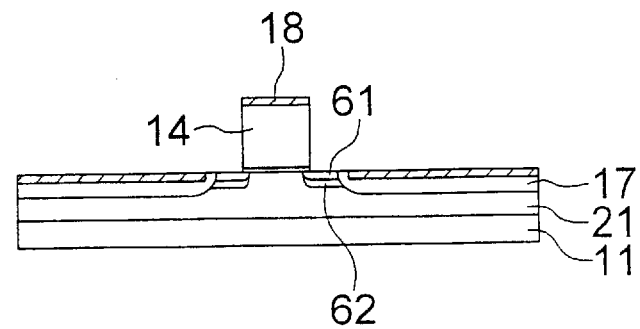

Now, the present invention is more specifically described with reference to accompanying drawings, wherein similar constituent elements are designated by similar reference numerals throughout the drawings.

FIGS. 2A to 2G show a fabrication process according to an embodiment of the present invention. In this embodiment, fabrication of an nMOSFET is exemplified. However, present invention is applicable to any of nMOSFET, pMOSFET, CMOSFET and a combination thereof, by modification of the embodiment with respect to the conductivity-type of the impurity ions.

Figure 2A:
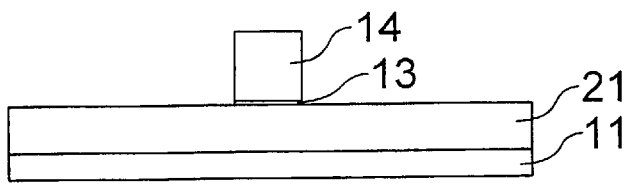
FIGS. 2A to 2G are sectional views of a MOSFET for showing consecutively steps of a fabrication process according to an embodiment of the present invention.

In FIG. 2A, the surface area of a semiconductor substrate 11 is doped with boron as p-type impurities to form a p-well 21. A gate insulator film 13 is formed on the p-well 21 so that the p-well 21 defines specified electric characteristics such as a threshold voltage. The gate insulator film 13 is made of silicon oxide or silicon oxide nitride film including nitrogen at a concentration of 2 to 5%, in the case of a 0.1-$\mu$m-rule nMOSFET operating at a source voltage of 1.2 volts. A gate electrode 14 made of polysilicon having a thickness of 150 nm, for example, is formed on the gate insulator film 13. In an alternative, the gate electrode 14 may be made of polycrystalline silicon/germanium including germanium at a concentration of 2 to 10%.

Figure 2B:
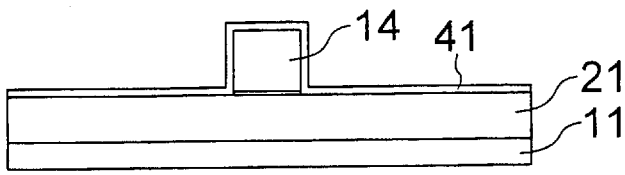
Figure 2C:
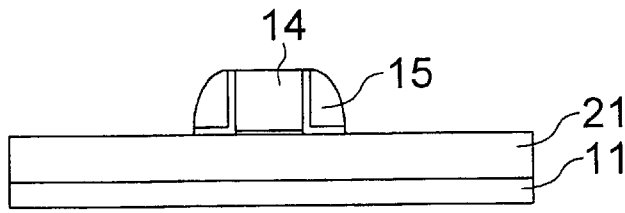

After forming the gate electrode 14, as shown in FIG. 2B, the polysilicon constituting the gate electrode 14 and the exposed surface of the silicon substrate 11 are nitrided to form silicon nitride films 41. The nitriding process is conducted to protect the edges of the gate insulator film 13 against an etching ambient during a later etching process for forming side-walls. In this embodiment, in view that the gate insulator film 13 has a thickness of 2 nm and the side-wall oxide film has a thickness of 50 to 70 nm, the nitriding process is conducted under the conditions wherein a thickness of 3 nm is obtained for the silicon nitride film considering the etching conditions for the side-wall film. After the nitriding, the edges of the gate insulator film 13 are nitrided whereby the gate electrode 14 is effectively covered by silicon nitride film 41. The nitriding process is conducted by a heat treatment in a $NH_3$ ambient at a normal pressure and at a substrate temperature of 800 to 900° C. for 60 seconds.

Subsequently, a 70-nm-thick silicon oxide film is deposited, and etched-back by using an anisotropic etching technique, whereby side-wall films 15 are left on both sides of the gate electrode 14. The silicon oxide film is deposited by a low-pressure CVD (LP-CVD) technique using TEOS as a source material at a substrate temperature of 700 to 800° C. In the etch-back, the, silicon oxide film is selectively etched in the condition substantially without involving an etching of the silicon substrate. In this etch-back step, the silicon nitride film 41 having a thickness of 3 nm is substantially completely removed on the source/drain diffused regions due to the small thickness. In an ordinary condition of the etch-back of a silicon oxide film, although the silicon nitride film generally has an etching selectivity comparable to the etching selectivity of the silicon substrate, the silicon nitride film is substantially completely removed on the source/drain diffused regions in this step as described above, due to the small thickness thereof and a subsequent cleaning process conducted. The thickness, 3 nm, of the silicon nitride film is generally determined in consideration of both the protection of the gate insulator film 13 and achievement of a desired depth for the shallow junction.

Figure 2D:
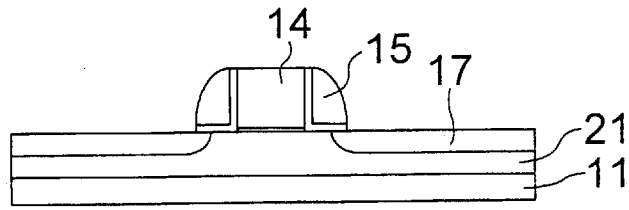

An ion-implantation is then conducted to form source/drain diffused regions 17. The conditions of the ion-implantation is such that arsenic ions are implanted at an acceleration energy of 25 keV at a dosage of 5E15. Then, a rapid thermal annealing is conducted for activation of implanted ions, as shown in FIG. 2D in a nitrogen ambient at a normal pressure and at a temperature of 900 to 1000° C. for 10 seconds.

Thereafter, cobalt silicide layers 18 are to be formed on the 0.1-$\mu$m-thick gate electrode 14 and the source/drain diffused regions 17. For this purpose, after native oxide films formed on the gate electrode 14 and the source/drain diffused regions 17 are removed by a surface treatment using hydrofluoric acid etc., a thin cobalt film having a thickness of about 10 nm is deposited on the entire surface by a vacuum evaporation or sputtering technique. Subsequently, the cobalt film is subjected to a heat treatment using a rapid thermal annealing technique in a nitrogen ambient for silicidation, whereby the cobalt films on the polysilicon constituting the gate electrode 14 and the silicon constituting the source/drain diffused regions 17 are silicified to form cobalt silicide films.

Figure 2E:
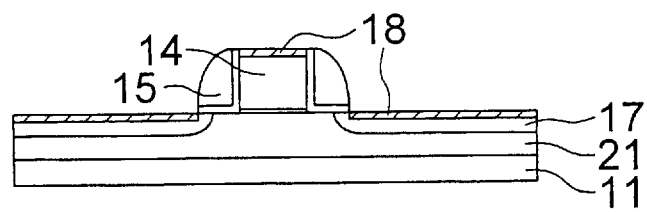

In the above silicide process, the thin cobalt film is annealed at a temperature of 700° C. in a nitrogen ambient. At this stage, the cobalt on the silicon and the polysilicon assumes a precursory state just before forming cobalt silicide and the cobalt on the other area stays as it is or unreacted state. Thus, a surface treatment using hydrochloric acid and conducted at this stage removes the unreacted cobalt selectively from the precursory state cobalt. After a subsequent additional heat treatment at a temperature of about 800° C. in a nitrogen ambient, substantially all the precursory state cobalt on the silicon and the polysilicon is reacted to form cobalt silicide layers on top of the gate electrode 14 and the surface of the source/drain diffused regions 17, as shown in FIG. 2E.

Figure 2F:
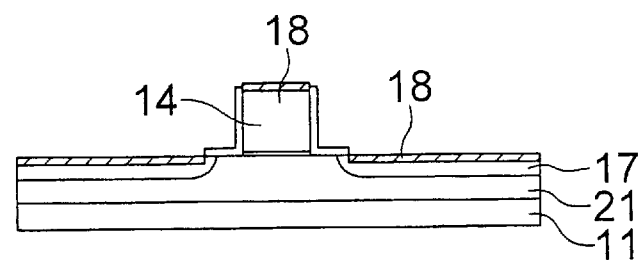

Thereafter, the silicon oxide films constituting the side-walls are removed, followed by an ion-implantation through the silicon nitride film 41 to form SD-extensions 61 which bridge the source/drain regions 17 and the channel region. The removal of the side-walls 15 is conducted by using a hydrofluoric acid based etchant. In this step, the sides of the gate electrode 14 and the source/drain diffused regions 17 are not etched due to the coverage by the silicon nitride film 41, whereas the cobalt silicide layers are hardly dissolved in the hydrofluoric acid, whereby the structure shown in FIG. 2F is obtained.

Figure 2G:
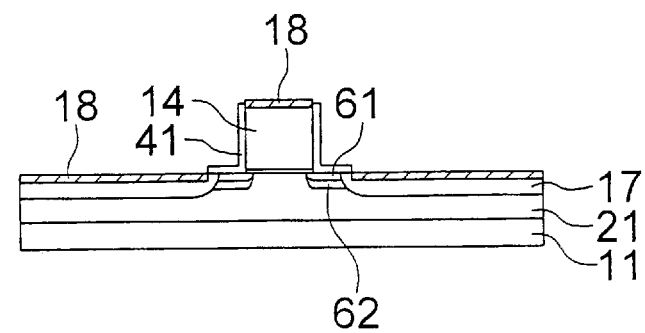

Subsequently, as shown in FIG. 2G, ion-implantation steps are conducted for additional implanting of SD-extensions, and for forming pocket structures 62 right under the SD-extensions, the pocket structures 62 assuring the short-channel characteristics. The latter step is called a pocket ion-implantation. In the exemplified case of forming an nMOSFET, the ion-implantation for SD-extensions 61 is such that arsenic ions are implanted by an acceleration energy of 2 keV at a dosage of 5E14, whereas the pocket ion-implantation is such that $BF_2$ ions are implanted by an acceleration energy of 30 keV at a dosage of 1.5E13 and at an injection angle of 30°. In FIG. 2G, the SD-extensions 61 and underlying pocket structures 62 are disposed adjacent to respective source/drain diffused regions 17 at the edges of the source/drain regions 17 opposing each other.

After the ion-implantation steps for SD-extensions 61 and pocket structures 62, an activation step is conducted for activating the implanted ions at a temperature below the maximum of the temperatures at which the cobalt silicide layers 18 are formed. In the present embodiment, the cobalt silicide layers 18 are formed by a two-stage heat treatment in a nitrogen ambient, wherein the maximum temperature is 800° C. Thus, the activation step for the impurity ions is conducted below 800° C., for example at 750 to 790° C. in a nitrogen ambient.

The subsequent steps are similar to those in the conventional process, including the steps of forming an insulator film, forming contact-holes, forming an interconnect layer.

For fabrication of a pMOSFET instead of the nMOSFET, the conductivity-types of the ions for ion-implantation are reversed and injection ranges are modified accordingly, whereby a pMOSFET having excellent short-channel characteristics can be obtained.

Figure 3:
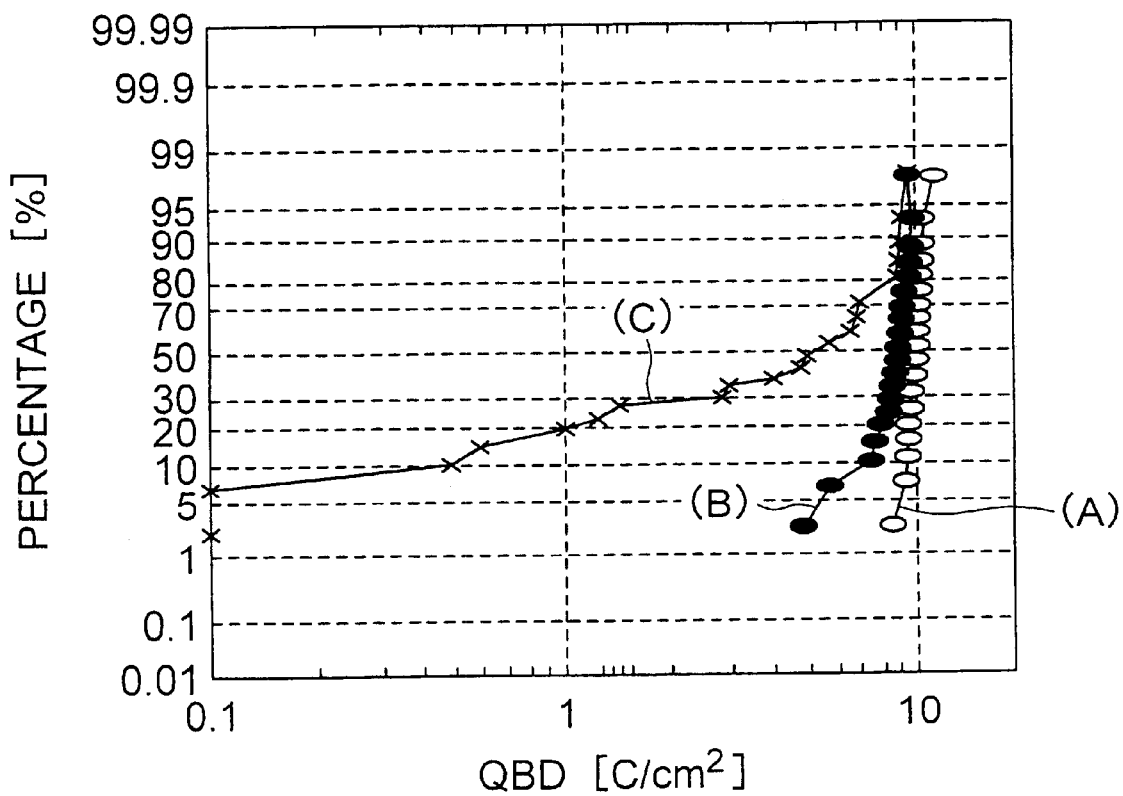
FIG. 3 is a graph for comparing the characteristics of MOSFETs formed by the present invention and the conventional method.

FIG. 3 shows the results of comparison of the nMOSFET of the present embodiment against the conventional nMOSFET with respect to a QBD characteristic. The term "QBD" in QBD characteristic as used herein means an index indicating a total electric charge per unit area injected in an insulator film before the insulator film is break-down by the potential thereof. In general, a MOSFET having a higher QBD for the gate insulator film has a higher reliability. In FIG. 3, QBD is plotted on the abscissa in coulomb/cm$^2$, whereas the ratio of the number of destructed oxide films to the total oxide films under the test is plotted on the ordinate.

In FIG. 3, curve "A" shows the QBD characteristic for a MOS capacitor, which is considered to indicate an initial characteristic not affected by a heat treatment, curve "B" shows the QBD characteristic for the nMOSFET manufactured by the method of the present embodiment, and curve "C" shows the QBD characteristic for the nMOSFET manufactured by the conventional method. As understood from FIG. 3, curve "B" shows a QBD characteristic close to curve "A", which means the gate insulator film of the nMOSFET formed by the present embodiment has an excellent characteristic of reliability over the nMOSFET formed by the conventional method.

In the fabrication process of the present embodiment, since the SD-extensions have a shallower junction depth because the heat treatment for the silicide process, which limited the depth of the SD-extensions defining the short-channel characteristics in the conventional method, is conducted before the ion-implantation for forming the SD-extensions. and in addition, the temperature of the heat treatment for the silicide process is suppressed to a lower level, the resultant SD-extensions can be well controlled to have a smaller junction depth. Thus, the MOSFET fabricated by the embodiment of the present embodiment has excellent short-channel characteristics as well as a higher reliability.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a MOSFET comprising the steps of forming a gate electrode having a top surface including silicon and source/drain diffused regions disposed in operative relationship with the gate electrode in a silicon substrate, forming a refractory metal film at least on the gate electrode and the source/drain diffused regions, reacting the refractory metal film with underlying silicon to form a refractory metal silicide layer, implanting impurity ions into a portion of the silicon substrate to form source/drain extensions adjacent to the source/drain regions, and diffusing the impurity ions in the source/drain extensions at a temperature which is lower than a maximum of temperatures at which said reacting step is conducted.

2. The method as defined in claim 1, said step of forming the gate electrode and the source/drain diffused regions include the step of forming side-walls on both sides of the gate electrode, each of the side-walls having a two-layer structure including a silicon oxide film and an underlying silicon nitride film.

3. The method as defined in claim 2, further including the step of removing said silicon oxide film, wherein said implanting step implants the impurity ions through the silicon nitride film.

4. The method as defined in claim 3, wherein silicon nitride film is 3 nm thick or less.

5. The method as defined in claim 1, wherein said reacting step includes a first heat treatment at a first temperature, removing a portion of the refractory metal film not reacted at said first heat treatment, and a second heat treatment at a second temperature higher than said first temperature.

6. The method as defined in claim 1, wherein said refractory metal is cobalt.

7. The method as defined in claim 1, wherein said step of diffusing impurity ions is conducted at a temperature between 750° C. and 790° C.

* * * * *